US009310819B2

(12) United States Patent
Guerra et al.

(10) Patent No.: US 9,310,819 B2
(45) Date of Patent: Apr. 12, 2016

(54) POWER CONVERTER INCLUDING INTEGRATED DRIVER PROVIDING OVERCURRENT PROTECTION

(71) Applicant: International Rectifier Corporation, El Segundo, CA (US)

(72) Inventors: Alberto Guerra, Palos Verdes Estates, CA (US); Sergio Morini, Pavia (IT); Marco Giandalia, Marina del Rey, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 117 days.

(21) Appl. No.: 13/958,320

(22) Filed: Aug. 2, 2013

(65) Prior Publication Data

US 2014/0070786 A1    Mar. 13, 2014

Related U.S. Application Data

(60) Provisional application No. 61/698,508, filed on Sep. 7, 2012.

(51) Int. Cl.
*G05F 1/618*    (2006.01)
*H03K 17/082*    (2006.01)
*H03K 17/687*    (2006.01)

(52) U.S. Cl.
CPC ............ *G05F 1/618* (2013.01); *H03K 17/0822* (2013.01); *H03K 2017/6875* (2013.01)

(58) Field of Classification Search
CPC ............................ H02M 3/156; H02M 3/1588
USPC .......................................................... 323/285
See application file for complete search history.

(56) References Cited

U.S. PATENT DOCUMENTS

| 7,289,308 | B2 * | 10/2007 | Kimura .................... 361/93.1 |
| 2009/0180304 | A1 * | 7/2009 | Bahramian et al. ........... 363/124 |
| 2011/0053547 | A1 * | 3/2011 | Yahav et al. ................... 455/317 |
| 2012/0126791 | A1 * | 5/2012 | Nakatake ........... H03K 17/0822 324/123 R |

* cited by examiner

*Primary Examiner* — Jessica Han
*Assistant Examiner* — Bart Iliya
(74) *Attorney, Agent, or Firm* — Farjami & Farjami LLP

(57) ABSTRACT

In one implementation, a power converter includes an output stage integrated circuit (IC) in a group III-V die including a depletion mode group III-V transistor, and a driver IC in a group IV die. The driver IC is configured to drive the output stage IC. In addition, a group IV control switch in the group IV die is cascoded with the depletion mode group III-V transistor. The power converter further includes an overcurrent protection circuit for the depletion mode group III-V transistor, the overcurrent protection circuit monolithically integrated in the group IV die.

20 Claims, 4 Drawing Sheets

POWER CONVERTER INCLUDING INTEGRATED DRIVER PROVIDING OVERCURRENT PROTECTION

The present application claims the benefit of and priority to a pending provisional application entitled "Power Switch Driver with Integrated Current Sensing," Ser. No. 61/698,508 filed on Sep. 7, 2012. The disclosure in this pending provisional application is hereby incorporated fully by reference into the present application.

BACKGROUND

I. Definitions

As used herein, the phrase "group III-V" refers to a compound semiconductor including at least one group III element and at least one group V element. By way of example, a group III-V semiconductor may take the form of a III-Nitride semiconductor. "III-Nitride", or "III-N", refers to a compound semiconductor that includes nitrogen and at least one group III element such as aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), aluminum indium gallium arsenide phosphide nitride ($Al_xIn_yGa_{(1-x-y)}As_aP_bN_{(1-a-b)}$), for example. III-Nitride also refers generally to any polarity including but not limited to Ga-polar, N-polar, semi-polar, or non-polar crystal orientations. A III-Nitride material may also include either the Wurtzitic, Zincblende, or mixed polytypes, and may include single-crystal, monocrystalline, polycrystalline, or amorphous structures. Gallium nitride or GaN, as used herein, refers to a III-Nitride compound semiconductor wherein the group III element or elements include some or a substantial amount of gallium, but may also include other group III elements in addition to gallium. A group III-V or a GaN transistor may also refer to a composite high voltage enhancement mode transistor that is formed by connecting the group III-V or the GaN transistor in cascode with a lower voltage group IV transistor.

In addition, as used herein, the phrase "group IV" refers to a semiconductor that includes at least one group IV element such as silicon (Si), germanium (Ge), and carbon (C), and may also include compound semiconductors such as silicon germanium (SiGe) and silicon carbide (SiC), for example. Group IV also refers to semiconductor materials which include more than one layer of group IV elements, or doping of group IV elements to produce strained group IV materials, and may also include group IV based composite substrates such as silicon on insulator (SOI), separation by implantation of oxygen (SIMOX) process substrates, and silicon on sapphire (SOS), for example.

It is noted that, as used herein, the terms "low voltage" or "LV" in reference to a transistor or switch corresponds describes a transistor or switch with a voltage range of up to approximately fifty volts (50V). It is further noted that use of the term "midvoltage" or "MV" refers to a voltage range from approximately fifty volts to approximately two hundred volts (approximately 50V-200V). Moreover, the term "high voltage" or "HV", as used herein, refers to a voltage range from approximately two hundred volts to approximately twelve hundred volts (approximately 200V-1200V), or higher.

II. Background Art

Group III-V transistors, such as III-Nitride high electron mobility transistors (III-Nitride HEMTs), are often utilized in high power switching applications due to their performance advantages. For example, III-Nitride HEMTs combine a low on-state resistance with the ability to sustain relatively high operating voltages.

Despite their general robustness, however, group III-V power transistors can be susceptible to damage due to overcurrent conditions. For example, in operation, III-Nitride HEMTs may experience shoot through currents and/or may be exposed to short circuit load conditions, either of which can result in damage to or catastrophic failure of the III-Nitride HEMT.

SUMMARY

The present disclosure is directed to a power converter including an integrated driver providing overcurrent protection, substantially as shown in and/or described in connection with at least one of the figures, and as set forth more completely in the claims.

DETAILED DESCRIPTION

Figure 1:
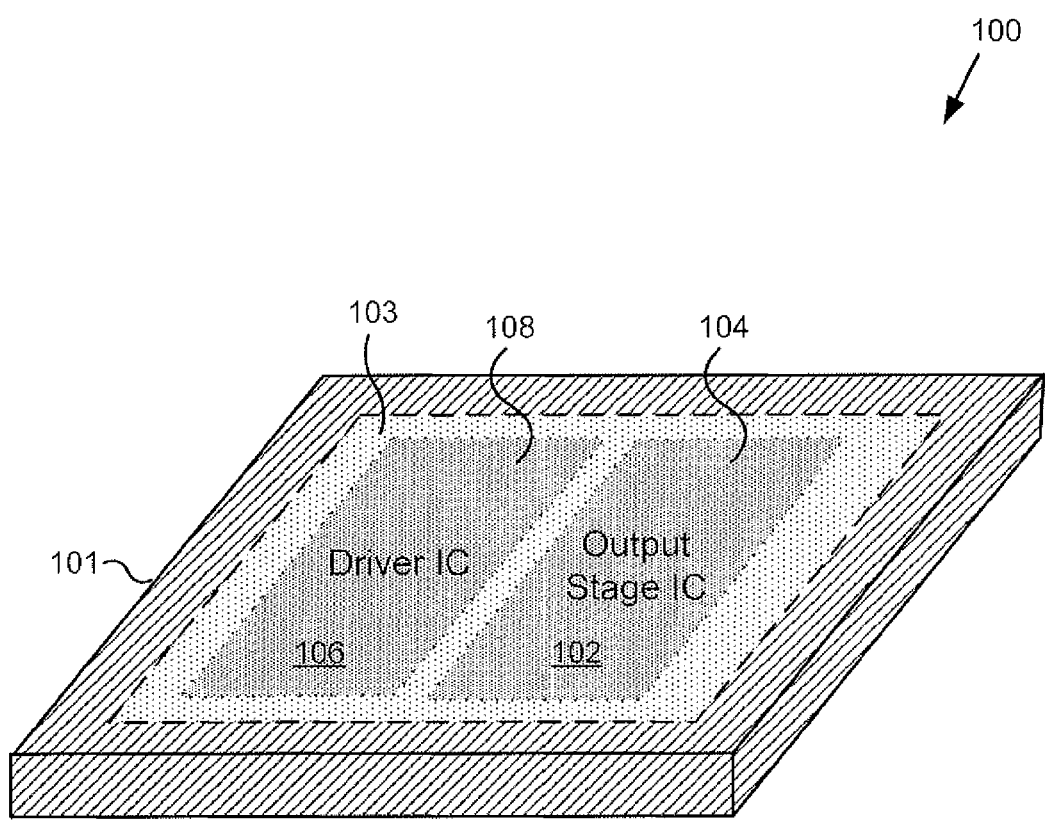
FIG. 1 shows a perspective view of a package containing a power converter including an output stage integrated circuit (IC) having one or more group III-V transistors, and a driver IC providing overcurrent protection for the group III-V transistors, according to one exemplary implementation.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Group III-V field-effect transistors (FETs), such as high electron mobility transistors (HEMTs) utilizing III-Nitride semiconductor materials, typically operate using piezoelectric polarization fields to generate a two-dimensional electron gas (2DEG) allowing for high current densities with low resistive losses. Because the 2DEG can arise naturally at a heterojunction interface of the III-Nitride or other group III-V materials forming the HEMT, conventional group III-V HEMTS typically conduct without the application of a gate potential. That is to say, conventional III-Nitride and other group III-V HEMTs tend to be depletion mode (i.e., normally ON) devices.

Although their high breakdown voltage, high current density, and low on-state resistance render group III-V HEMTs potentially advantageous for use in power applications, the normally ON nature of conventional group III-V HEMTs can give rise to problems when such depletion mode transistors are used as power switches. For example, in power applications it is typically desirable to avoid conducting current through the group III-V HEMTs before control circuitry is fully powered and operational. As a result, in power management applications where enhancement mode (i.e., normally OFF) characteristics of power switches are desirable, a depletion mode III-Nitride or other group III-V transistor can be cascoded with a control switch, such as a silicon or other group IV control switch, to produce an enhancement mode composite power switch.

Moreover, despite their general robustness, group III-V power transistors can be susceptible to damage due to overcurrent conditions. For example, in operation, III-Nitride HEMTs may experience shoot through currents and/or may be exposed to short circuit load conditions, either of which can result in damage to or catastrophic failure of the III-Nitride HEMT. Consequently, the performance and reliability of III-Nitride HEMTS and other group III-V power transistors, as well as composite power switches including such group III-V power transistors can benefit from overcurrent protection.

However, conventional solutions for providing overcurrent protection while also enabling enhancement mode functionality by a composite power switch including a depletion mode group III-V transistor typically require a hybrid assembly. For example, conventional designs may require multiple dies for implementation of the control, overcurrent, and power switching output circuitry. Moreover, such conventional solutions substantially preclude monolithic integration of multiple group III-V transistors, such as low-side and high-side transistors of a power stage, on a single semiconductor chip or die.

The present application discloses a power converter including an output stage integrated circuit (IC) in a group III-V die, and a driver IC fabricated in a group IV die and configured to drive the output stage IC. In one implementation, the group IV die includes a group IV control switch cascoded with a depletion mode group III-V transistor in the group III-V die, such that the depletion mode group III-V transistor operates as an enhancement mode group III-V transistor. In addition, the group IV die includes a monolithically integrated overcurrent protection circuit for the group III-V depletion mode transistor in the group III-V die.

The group IV control switch and overcurrent control circuit may be implemented using low voltage (LV) group IV devices, and may include silicon or other group IV field-effect transistors (FETs), such as metal-oxide-semiconductor FETs (MOSFETs), monolithically integrated with the driver IC. By monolithically integrating the group IV control switch and overcurrent protection circuitry into the driver IC, the present inventive concepts enable use of low voltage IC technology for fabrication of the group IV control switch, resulting in a very low $R_{DS\_ON}$ figure of merit for the group IV control switch output.

It is noted that in the interests of conceptual clarity, the present inventive principles will in some instances be described by reference to specific implementations including one or more gallium nitride (GaN) based depletion mode transistors. However, it is emphasized that such an implementation is merely exemplary, and the inventive principles disclosed herein are broadly applicable to a wide range of applications implemented using other III-Nitride material based, or other group III-V semiconductor based, depletion mode transistors.

FIG. 1 shows a perspective view of a package containing a power converter including an output stage IC having one or more depletion mode group III-V transistors, and a driver IC providing overcurrent protection for the depletion mode group III-V transistors, according to one exemplary implementation. Power converter 100 includes output stage IC 102 in group III-V die 104, and driver IC 106 in group IV die 108. As shown in FIG. 1, group IV die 108 including driver IC 106 and group III-V die 104 including output stage IC 102 are enclosed in package 101, which is shown as a multi-chip module (MCM) configured to contain only two semiconductor chips or dies, i.e., group IV die 108 and group III-V die 104.

In addition, and as further shown by FIG. 1, in some implementations package 101 may include optional heat spreader 103, which may overlie output stage IC 102 and driver IC 106, for example. It is noted that the perspective view shown by FIG. 1 is adapted in the interests of conceptual clarity so as to show output stage IC 102 and driver IC 106 as though seen through the enclosure provided by package 101, and as though seen through optional heat spreader 103.

Group III-V die 104 may be formed as a III-Nitride die, and may have one or more layers including gallium nitride (GaN), for example. Group IV die 108 may be implemented as a silicon die. Group IV die 108 includes driver IC 106 for driving output stage IC 102 in group III-V die 104. Although not explicitly shown in FIG. 1, output stage IC 102 includes one or more depletion mode group III-V transistors, which may be monolithically integrated in group III-V die 104. In addition, although also not shown in FIG. 1, driver IC 106 may include a monolithically integrated control switch and overcurrent protection circuit for each depletion mode group III-V transistor(s) in group III-V die 104. As will be described more fully below, each group IV control switch is cascoded with a respective depletion mode group III-V transistor, resulting in the depletion mode group III-V transistor(s) being operable as respective one or more enhancement mode group III-V transistors.

Package 101 may be implemented utilizing a quad-flat no-leads (QFN) package design, for example. In such an implementation, output stage IC 102 and driver IC 106 may be flip chip mounted within package 101 so as to make electrical connection with one another through a package substrate or lead frame of package 101. Package 101 may be a lead frame package, or may be formed using a laminate technology, as known in the art. Inclusion of optional heat spreader 103 in package 101 can advantageously improve thermal dissipation and thereby enhance high power operation by power converter 100.

The exemplary packaging solution depicted in FIG. 1 includes several desirable features. For example, utilizing package 101 having a substantially no-leads package design advantageously reduces parasitic inductances and capacitances of power converter 100. In addition, by utilizing only two discrete semiconductor dies to produce its desired functionality, package 101 further reduces parasitic inductances and capacitances while concurrently enabling a substantial reduction in package size when compared to conventional implementations having a hybrid assembly requiring additional chips or dies.

In some implementations, power converter 100 including output stage IC 102 and driver IC 106 may have a single composite power switch configured for use in a single-ended synchronous rectifier, for example. In other implementations, power converter 100 may include multiple depletion mode group III-V transistors in output stage IC 102, such as two depletion mode GaN or other III-Nitride HEMTs, for example. Consequently, power converter 100 may be advantageously utilized as a voltage converter, for example a buck converter, in a variety of applications.

Figure 2:
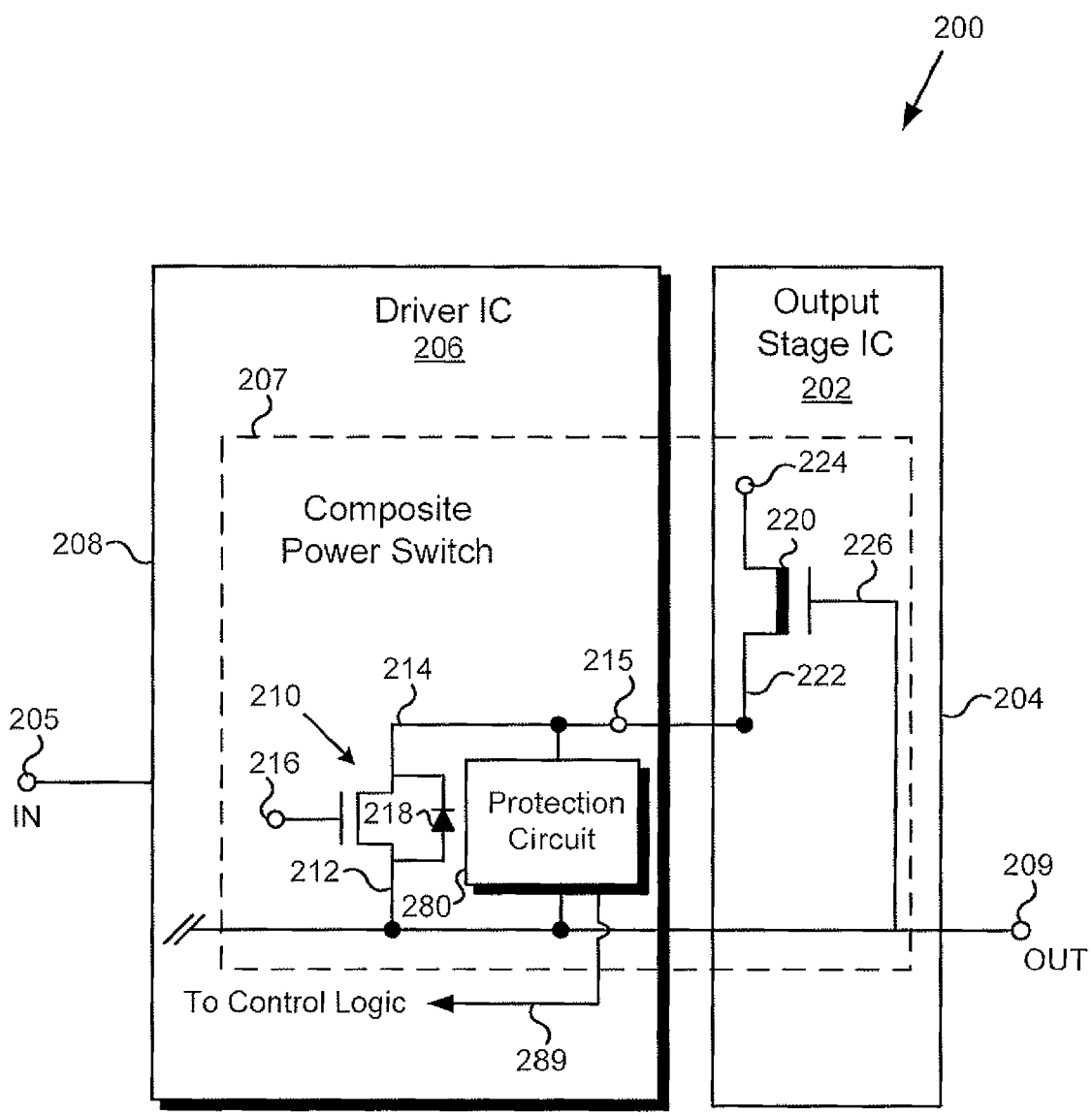
FIG. 2 shows a diagram of an exemplary power converter including an output stage IC having a group III-V transistor, and a driver IC providing overcurrent protection for the group III-V transistor.

Moving to FIG. 2, FIG. 2 shows a diagram of exemplary power converter 200 having output stage IC 202 including depletion mode group III-V transistor 220 in group III-V die 204, and driver IC 206 in group IV die 208. Driver IC 206 includes monolithically integrated overcurrent protection circuit 280 configured to provide overcurrent protection for depletion mode group III-V transistor 220. As shown in FIG. 2, power converter 200 can receive a signal corresponding to an input voltage at input 205 of driver IC 206, and to provide a converted voltage, e.g., a stepped down voltage, at output 209 of output stage IC 202. Power converter 200 corresponds in general to the circuitry included in package 101, in FIG. 1. That is to say, output stage IC 202 in group III-V die 204 and driver IC 206 including overcurrent protection circuit 280 in group IV die 208, correspond respectively to output stage IC 102 in group III-V die 104 and driver IC 106 in group IV die 108, in FIG. 1.

Output stage IC 202 is implemented using single depletion mode group III-V transistor 220 in the form of a depletion mode HEMT. Depletion mode group III-V transistor 220 includes source 222, drain 224, and gate 226. Depletion mode group III-V transistor 220 may be a midvoltage (MV) or high voltage (HV) HEMT implemented as a GaN or other III-Nitride material based transistor, for example.

In addition to overcurrent protection circuit 280, driver IC 206 includes group IV control switch 210 configured for use with depletion mode group III-V transistor 220. Group IV control switch 210 may be implemented as an LV group IV transistor, such as an LV silicon based MOSFET, for example. Group IV control switch 210 includes source 212, drain 214, and gate 216. Also shown in FIG. 2 is body diode 218 of group IV control switch 210.

As shown in FIG. 2, group IV control switch 210 is implemented in driver IC 206 using an open drain configuration in which drain 214 of group IV control switch 210 provides input/output (I/O) node 215 of driver IC 206. As further shown in FIG. 2, group IV control switch 210 is cascoded with depletion mode group III-V transistor 220 and is coupled to overcurrent protection circuit 280 to form overcurrent protected composite power switch 207 spanning group III-V die 204 and group IV die 208. That is to say, depletion mode group III-V transistor 220 of composite power switch 207 is formed in group III-V die 204, while group IV control switch 210 and overcurrent protection circuit 280 are monolithically integrated in group IV die 208. Nevertheless, drain 214 of group IV control switch 210 is coupled to source 222 of depletion mode group III-V transistor 220 through I/O node 215, and gate 226 of depletion mode group III-V transistor 220 is coupled to source 212 of group IV control switch 210.

According to the implementation shown in FIG. 2, overcurrent protection circuit 280 is implemented in parallel with group IV control switch 210 and is configured to generate output signal 289, which is fed to a control logic block of driver IC 206 (control logic block not shown in FIG. 2). In other words, overcurrent protection circuit 280 is coupled between drain 214 and source 212 of group IV control switch 210 and is configured to generate output signal 289 to provide overcurrent protection for group III-V transistor 220. It is noted that the dashed lines shown outside of composite power switch 207 and to the left of source 212 of group IV control switch 210 indicates that source 212 of group IV control switch 210 may be connected to additional circuitry of driver IC 206 not shown in FIG. 2.

The operation of depletion mode group III-V transistor 220 as an enhancement mode transistor by group IV control switch 210 is now briefly described. When voltage is applied to drain 224 of depletion mode group III-V transistor 220 while depletion mode group III-V transistor 220 is ON, voltage will develop across reverse biased body diode 218 of group IV control switch 210. This voltage is inverted and applied to gate 226 of depletion mode group III-V transistor 220. Assuming that group IV control switch 210 and depletion mode group III-V transistor 220 are suitably selected such that group IV control switch 210 including body diode 218 can block a voltage in excess of a pinch-off voltage of depletion mode group III-V transistor 220, depletion mode group III-V transistor 220 will turn OFF and any additional increase in voltage at drain 224 will be sustained across group III-V transistor 220. Thereafter, depletion mode group III-V transistor 220 functions effectively as an enhancement mode group III-V transistor that can be selectively turned ON based on a gate voltage applied to gate 216 of group IV control switch 210.

Figure 3:
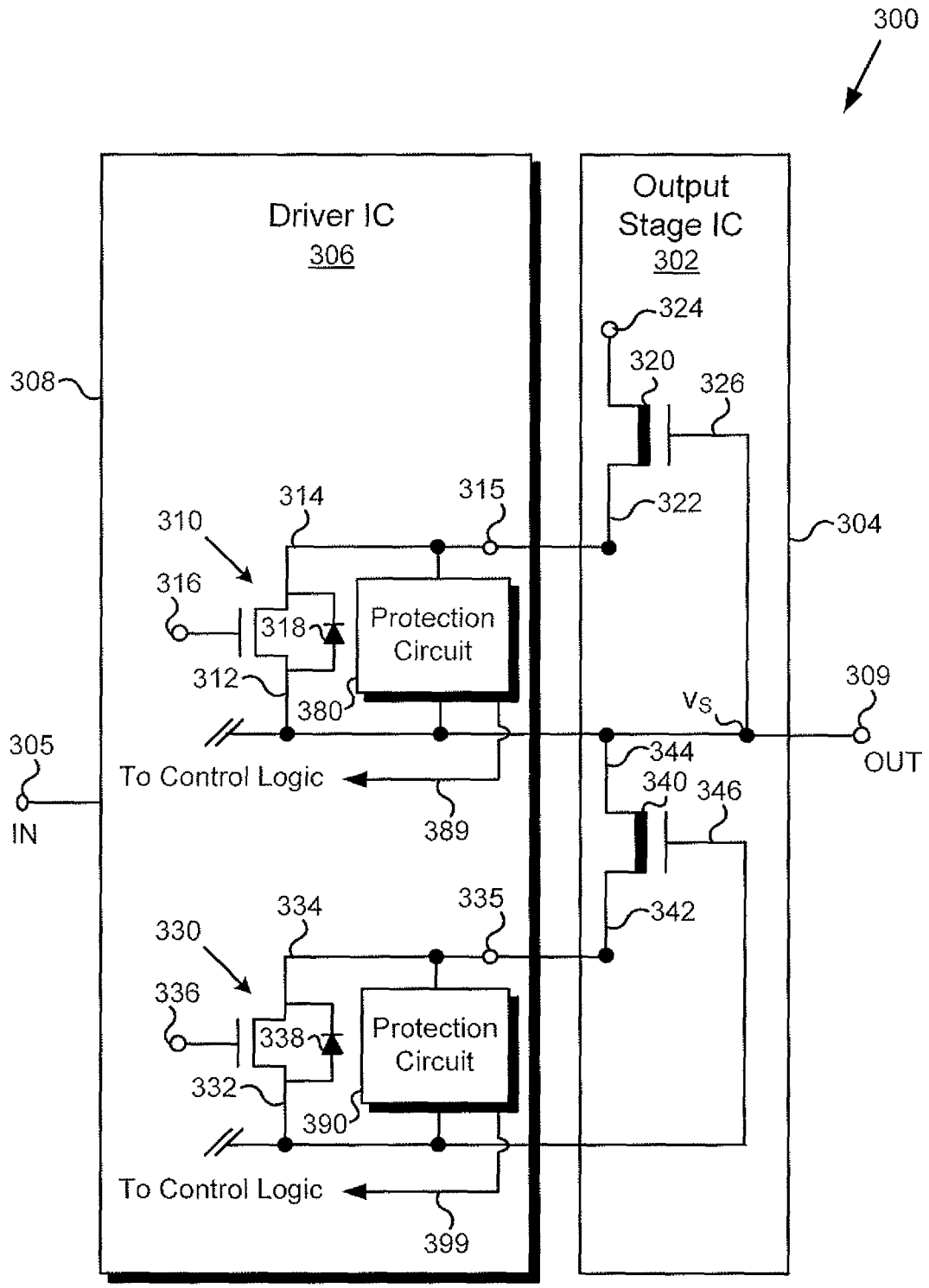
FIG. 3 shows a diagram of an exemplary power converter including an output stage IC having high side and low side group III-V transistors, and a driver IC providing overcurrent protection for the high side and low side group III-V transistors.

Referring now to FIG. 3, FIG. 3 shows a diagram of exemplary power converter 300 having output stage IC 302 including high side depletion mode group III-V transistor 320 and low side depletion mode group III-V transistor 340 in group III-V die 304, and driver IC 306 in group IV die 308. Driver IC 306 includes monolithically integrated high side and low side overcurrent protection circuits 380 and 390, respectively, configured to provide overcurrent protection for respective high side and low side depletion mode group III-V transistors 320 and 340.

As shown in FIG. 3, power converter 300 is configured to receive a signal corresponding to an input voltage at input 305 of driver IC 306, and to provide a converted voltage, e.g., a rectified and/or stepped down voltage, at output 309 of output stage IC 302. Power converter 300 corresponds in general to the circuitry within package 101, in FIG. 1. Moreover, driver IC 306 and output stage IC 302, in FIG. 3, correspond respectively to driver IC 106 and output stage IC 102, in FIG. 1, while either or both of high side and low side overcurrent protection circuits 380 and 390, in FIG. 3, correspond to overcurrent protection circuit 280, in FIG. 2.

Output stage IC 302 is implemented using high side and low side depletion mode group III-V transistors 320 and 340 monolithically integrated in group III-V die 304. High side depletion mode group III-V transistor 320 includes source 322, drain, 324, and gate 326, while low side depletion mode group III-V transistor 340 includes source 342, drain 344, and gate 346. Respective high side and low side depletion mode group III-V transistors 320 and 340 may be MV or HV HEMTs implemented as GaN or other III-Nitride based transistors, for example.

High side and low side depletion mode group III-V transistors 320 and 340 are driven by respective high side and low side group IV control switches 310 and 330 monolithically integrated in group IV die 308. High side and low side group IV control switches 310 and 330 may be implemented as silicon FETs, such as LV silicon based MOSFETs, for example. High side group IV control switch 310 includes source 312, drain 314, and gate 316, while low side group IV control switch 330 includes source 332, drain 334, and gate 336. Also shown in FIG. 3 are body diodes 318 and 338 of respective high side and low side group IV control switches 310 and 330, and switch node $V_S$ of output stage IC 302.

As shown in FIG. 3, high side and low side group IV control switches 310 and 330 are implemented in driver IC 306 using an open drain configuration wherein drains 314 and 334 of respective high side and low side group IV control switches 310 and 330 provide respective I/O nodes 315 and 335 of driver IC 306. As further shown in FIG. 3, high side group IV control switch 310 is cascoded with high side depletion mode group III-V transistor 320 to form a high side composite power switch, and low side group IV control switch 330 is cascoded with low side depletion mode group III-V transistor 340 to form a low side composite power switch. That is to say, drain 314 of high side group IV control switch 310 is coupled to source 322 of high side depletion mode group III-V transistor 320 through I/O node 315, and gate 326 of high side depletion mode group III-V transistor 320 is coupled to source 312 of high side group IV control switch 310. In addition, drain 334 of low side group IV control switch 330 is coupled to source 342 of low side depletion mode group III-V transistor 340 through I/O node 335, and gate 346 of low side depletion mode group III-V transistor 340 is coupled to source 332 of low side group IV control switch 330.

According to the implementation shown in FIG. 3, high side overcurrent protection circuit 380 is implemented in parallel with high side group IV control switch 310 and is configured to generate output signal 389, which is fed to a high side control logic block of driver IC 306 (high side control logic block not shown in FIG. 3). In addition, low side overcurrent protection circuit 390 is implemented in parallel with low side group IV control switch 330 and is configured to generate output signal 399, which is fed to a low side control logic block of driver IC 306 (low side control logic block also not shown in FIG. 3).

Thus, high side overcurrent protection circuit 380 is coupled between drain 314 and source 312 of high side group IV control switch 310 and is configured to generate output signal 389 to provide overcurrent protection for high side group III-V transistor 320. Moreover, low side overcurrent protection circuit 390 is coupled between drain 334 and source 332 of low side group IV control switch 330 and is configured to generate output signal 399 to provide overcurrent protection for low side group III-V transistor 340. It is noted that the dashed lines shown to the left of sources 312 and 332 of respective high side and low side group IV control switches 310 and 330 indicate that sources 312 and 332 of respective high side and low side group IV control switches 310 and 330 may be connected to additional circuitry of driver IC 306 not shown in FIG. 3.

The operation of high side and low side depletion mode group III-V transistors 320 and 340 as enhancement mode transistors is analogous to that described above by reference to the implementation shown in FIG. 2. As a result of the implementation shown in FIG. 3, high side and low side depletion mode group III-V transistors 320 and 340 are operable as enhancement mode transistors that can be selectively turned ON based on a gate voltage applied, respectively, to gates 316 and 336 of respective high side and low side group IV control switches 310 and 330.

Figure 4:
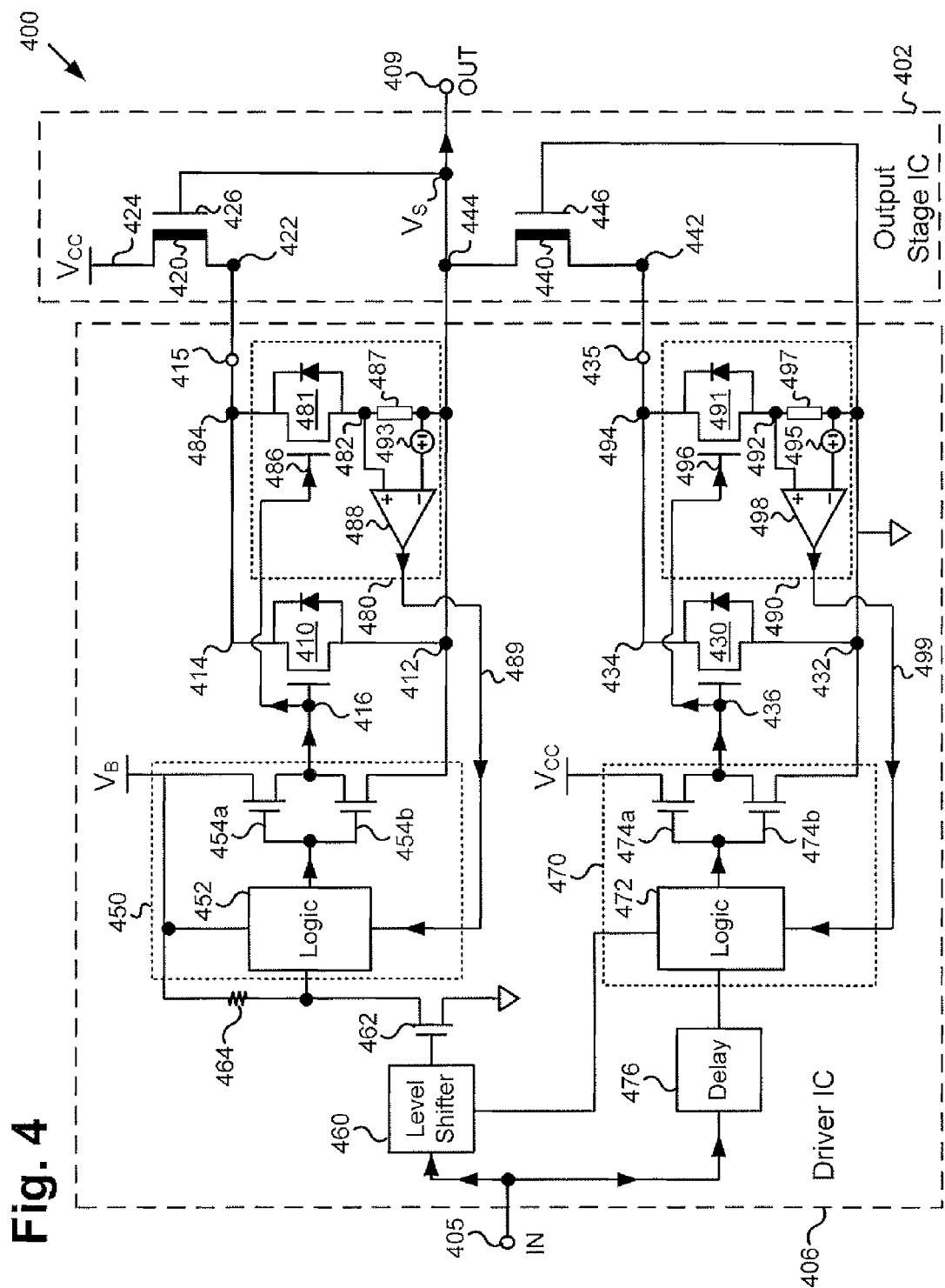
FIG. 4 shows a power converter circuit diagram corresponding to the exemplary power converter shown in FIG. 3, according to one implementation.

Turning to FIG. 4, FIG. 4 shows exemplary power converter circuit diagram 400 corresponding in general to power converter 300, in FIG. 3. Power converter circuit diagram 400 includes driver IC 406 having respective high side and low side group IV control switches 410 and 430, and respective high side and low side overcurrent protection circuits 480 and 490. Power converter circuit diagram 400 also includes output stage IC 402 with respective high side and low side depletion mode group III-V transistors 420 and 440. As shown in FIG. 4, the power converter represented by power converter circuit diagram 400 is configured to receive a signal corresponding to an input voltage at input 405 of driver IC 406, and to provide a converted voltage, e.g., a rectified and/or stepped down voltage, at output 409 of output stage IC 402.

Power converter circuit diagram 400 corresponds in general to the circuitry within package 101, in FIG. 1. Moreover, driver IC 406 and output stage IC 402, in FIG. 4, correspond respectively to driver IC 106 and output stage IC 102, in FIG. 1. In addition, output stage IC 402 including high side and low side depletion mode group III-V transistors 420 and 440, in FIG. 4, corresponds to output stage IC 302 including high side and low side depletion mode group III-V transistors 320 and 340, in FIG. 3. Furthermore, driver IC 406 including high side and low side group IV control switches 410 and 430 and high side and low side overcurrent protection circuits 480 and 490, in FIG. 4, corresponds to driver IC 306 including high side and low side group IV control switches 310 and 330 and high side and low side overcurrent protection circuits 380 and 390, in FIG. 3.

As shown in FIG. 4, according to the present exemplary implementation, high side and low side overcurrent protection circuits 480 and 490 are configured as respective high side and low side current sensing circuits monolithically integrated into driver IC 406. High side overcurrent protection circuit 480 includes current sense transistor 481, current sense element 487 in series with current sense transistor 481, and comparator 488 configured to compare the voltage across current sense element 487 with reference voltage 493. Analogously, exemplary low side overcurrent protection circuit 490 includes current sense transistor 491, current sense element 497 in series with current sense transistor 491, and comparator 498 configured to compare the voltage across current sense element 497 with reference voltage 495.

High side overcurrent protection circuit 480 is implemented in parallel with high side group IV control switch 410, and low side overcurrent protection circuit 490 is implemented in parallel with low side group IV control switch 430. Moreover, it is noted that current sense transistor 481 is implemented in parallel with high side group IV control switch 410, and current sense transistor 491 is implemented in parallel with low side group IV control switch 430. In other words, according to the exemplary implementation shown in FIG. 4, drain 484 of current sense transistor 481 is coupled to drain 414 of high side group IV control switch 410, and source 482 of current sense transistor 481 is coupled to source 412 of high side group IV control switch 410 through current sense element 487. Moreover, drain 494 of current sense transistor 491 is coupled to drain 434 of low side group IV control switch 430, and source 492 of current sense transistor 491 is coupled to source 432 of low side group IV control switch 430 through current sense element 497. In one implementation, for example, current sense elements 487 and 497 may take the form of respective current sense resistors.

Current sense transistors 481 and 491 may be implemented as LV group IV FETs, such as LV silicon based MOSFETs, for example. As shown in FIG. 4, like high side and low side group IV control switches 410 and 430, current sense transistors 481 and 491 are implemented in driver IC 406 using an open drain configuration wherein drains 484 and 494 of respective current sense transistors 481 and 491 are coupled to respective I/O nodes 415 and 435 of driver IC 406. As further shown in FIG. 4, current sense transistor 481 is cascoded with high side depletion mode group transistor 420 and current sense transistor 491 is cascaded with low side depletion mode group III-V transistor 440.

In addition to high side and low side group IV control switches 410 and 430 and high side and low side overcurrent protection circuits 480 and 490, driver IC 406 includes high side driver 450 and low side driver 470. High side driver 450 includes high side control logic block 452 and driver transistors 454a and 454b coupled in series as a half bridge between high voltage rail $V_B$ and the voltage at switch node $V_S$. High side driver 450 is coupled to input 405 of driver IC 406 by a level shift arrangement including level shifter block 460, level shift transistor 462, and resistor 464. Low side driver 470 includes low side control logic block 472 and driver transistors 474a and 474b coupled in series as a half bridge between voltage rail $V_{CC}$ and ground. Low side driver 470 is coupled to input 405 of driver IC 406 by delay block 476.

Level shifter block 460, level shift transistor 462, resistor 464, and high side driver 450 are configured to provide gate signals to high side group IV control switch 410 and current sense transistor 481, while delay block 476 and low side driver 470 are configured to provide gate signals to low side group IV control switch 410 and current sense transistor 491. Thus, in the present implementation, the control terminal of current sense transistor 481, i.e., gate 486, is tied to the control terminal of high side group IV control switch 410, i.e., gate 416. In addition, the control terminal of current sense transistor 491, i.e., gate 496, is tied to the control terminal of low side group IV control switch 430, i.e., gate 436. Moreover, comparator 488 of high side overcurrent protection circuit 480 is configured to feed output signal 489 to high side control logic block 452 of high side driver 450, while comparator 498 of low side overcurrent protection circuit 490 is configured to feed output signal 499 to low side control logic block 472 of low side driver 470.

Current sense transistor 481 may be implemented so as to have a reduced gain relative to high side group IV control switch 410. In addition, current sense transistor 491 may be implemented so as to have a correspondingly reduced gain relative to high side group IV control switch 410. Thus, high side and low side overcurrent protection circuits 480 and 490 may be configured to sense a predetermined fraction of the currents passing through respective high side and low side depletion mode group III-V transistors 420 and 440. For example, high side and low side overcurrent protection circuits 480 and 490 may be configured to sense approximately a tenth (1/10), or a hundredth (1/100), of the currents passing through respective high side and low side depletion mode group III-V transistors 420 and 440. High side and low side overcurrent protection circuits 480 and 490 are configured to provide shutdown signals as respective output signals 489 and 499 fed to respective high side and low side control logic blocks 452 and 472, to turn respective high side and/or low side depletion mode group III-V transistors 420 and 440 OFF in the event that an overcurrent condition is sensed.

It is noted that because high side and low side group IV control switches 410 and 430 and high side and low side overcurrent protection circuits 480 and 490 are monolithically integrated with driver IC 406, i.e., fabricated on the chip or die providing driver IC 406, high side and low side depletion mode group III-V transistors 420 and 440 are structurally independent of respective high side and low side group IV control switches 410 and 430 and current sense transistors 481 and 491. As a result, the present solution enables implementation of output stage IC 402 using a monolithically integrated approach in which high side and low side depletion mode group III-V transistors 420 and 440 are fabricated on a common chip or die. For example, the lateral configurations adopted in many III-nitride HEMT topologies lend themselves to such monolithic integration. Consequently, power converter circuit diagram 400 can be physically implemented using as few as two chips or dies. For example, a single group IV chip or die may provide driver IC 406 including high side and low side group IV control switches 410 and 430 and high side and low side overcurrent protection circuits 480 and 490. In addition, a single group III-V chip or die may provide high side and low side depletion mode group III-V transistors 420 and 440.

Thus, the present application discloses a driver IC with integrated overcurrent protection for use with one or more depletion mode group III-V transistors. In one implementation, an overcurrent protection circuit configured as a current sensing circuit integrated monolithically into the driver IC senses an overcurrent condition in a depletion mode group III-V transistor. By integrating such an overcurrent protection circuit into the driver IC, the present inventive concepts advantageously enable use of low voltage IC technology for fabrication of the overcurrent protection circuitry. In addition, by assembling the driver IC and one or more power switches in an MCM or other package type using a substantially no-leads package design, implementations of the present solution advantageously reduce parasitic inductances and capacitances. Moreover, by utilizing only two discrete semiconductor dies to implement power conversion functionality when using normally ON, depletion mode, power switches configured to operate as normally OFF switches, the present solution further reduces parasitic inductances and capacitances, while concurrently substantially minimizing package size. Consequently, the present application discloses a solution capable of enhancing power conversion performance across a wide variety of applications.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A power converter comprising:
an output stage integrated circuit (IC) in a group III-V die including a depletion mode group III-V transistor;
a driver IC in a group IV die for driving said output stage IC;
a group IV control switch in said group IV die cascoded with said depletion mode group III-V transistor;
an overcurrent protection circuit for said depletion mode group III-V transistor, said overcurrent protection circuit monolithically integrated in said group IV die;
wherein said overcurrent protection circuit is in parallel with said group IV control switch.

2. The power converter of claim 1, wherein said power converter is enclosed in a package configured to contain only said group IV die and said group III-V die.

3. The power converter of claim 1, wherein said overcurrent protection circuit comprises a current sensing circuit configured to sense a predetermined fraction of a current through said depletion mode group III-V transistor.

4. The power converter of claim 1, wherein said overcurrent protection circuit includes a transistor having a control terminal tied to a control terminal of said group IV control switch.

5. The power converter of claim 1, wherein an output signal of said overcurrent protection circuit is fed to a control logic block of said driver IC.

6. The power converter of claim 1, wherein said depletion mode group III-V transistor comprises a III-Nitride high electron mobility transistor (HEMT).

7. The power converter of claim 1, wherein said group IV control switch comprises a silicon control field-effect transistor (FET), said overcurrent protection circuit being coupled between a drain and a source of said silicon control FET.

8. A power converter comprising:
an output stage integrated circuit (IC) including a high side depletion mode group III-V transistor and a low side depletion mode group III-V transistor monolithically integrated in a group III-V die;
a driver IC in a group IV die for driving said output stage IC;
a high side group IV control switch in said group IV die cascoded with said high side depletion mode group III-V transistor;
a low side group IV control switch in said group IV die cascoded with said low side depletion mode group III-V transistor;
a high side overcurrent protection circuit for said high side depletion mode group III-V transistor, wherein said high side overcurrent protection circuit is in parallel with said high side group IV control switch;
a low side overcurrent protection circuit for said low side depletion mode group III-V transistor, wherein said low side overcurrent protection circuit is in parallel with said low side group IV control switch;
said high side and low side overcurrent protection circuits monolithically integrated in said group IV die.

9. The power converter of claim 8, wherein said power converter is enclosed in a package configured to contain only said group IV die and said group III-V die.

10. The power converter of claim 8, wherein said high side and low side overcurrent protection circuits comprise current sensing circuits configured to sense a predetermined fraction of a current through said respective high side and low side depletion mode group III-V transistors.

11. The power converter of claim 8, wherein an output signal of said high side overcurrent protection circuit is fed to a high side control logic block of said driver IC, and an output signal of said low side overcurrent protection circuit is fed to a low side control logic block of said driver IC.

12. The power converter of claim 8, wherein said high side and low side depletion mode group III-V transistors comprise III-Nitride high electron mobility transistors (HEMTs).

13. The power converter of claim 8, wherein said high side and low side group IV control switches comprise silicon control field-effect transistor (FETs), said high side and low side overcurrent protection circuits respectively coupled between a drain and a source of said high side and low side silicon control FETs.

14. A power converter comprising:
an output stage integrated circuit (IC) in a group III-V die including a depletion mode group III-V transistor;
a driver IC in a group IV die for driving said output stage IC;
an overcurrent protection circuit for said depletion mode group III-V transistor, said overcurrent protection circuit monolithically integrated in said group IV die;
wherein said overcurrent protection circuit is in parallel with said group IV control switch;
a group IV control switch in said group IV die cascoded with said depletion mode group III-V transistor, such that said depletion mode group III-V transistor operates as an enhancement mode group III-V transistor.

15. The power converter of claim 14, wherein said power converter is enclosed in a package configured to contain only said group IV die and said group III-V die.

16. The power converter of claim 14, wherein said overcurrent protection circuit comprises a current sensing circuit configured to sense a predetermined fraction of a current through said depletion mode group III-V transistor.

17. The power converter of claim 14, wherein said overcurrent protection circuit includes a transistor having a control terminal tied to a control terminal of said group IV control switch.

18. The power converter of claim 14, wherein an output signal of said overcurrent protection circuit is fed to a control logic block of said driver IC.

19. The power converter of claim 14, wherein said depletion mode group III-V transistor comprises a III-Nitride high electron mobility transistor (HEMT).

20. The power converter of claim 14, wherein said group IV control switch comprises a silicon control field-effect transistor (FET), said overcurrent protection circuit being coupled between a drain and a source of said silicon control FET.

* * * * *